United States Patent [19]

Snow

[11] Patent Number: 4,597,057
[45] Date of Patent: Jun. 24, 1986

[54] SYSTEM FOR COMPRESSED STORAGE OF 8-BIT ASCII BYTES USING CODED STRINGS OF 4 BIT NIBBLES

[75] Inventor: Craig A. Snow, Manhattan Beach, Calif.

[73] Assignee: System Development Corporation, Santa Monica, Calif.

[21] Appl. No.: 336,413

[22] Filed: Dec. 31, 1981

[51] Int. Cl.⁴ ............... G06F 3/023; G06F 7/02; G06F 5/00; G06F 13/00
[52] U.S. Cl. ............................. 364/900; 340/347 DD
[58] Field of Search ... 364/200 MS File, 900 MS File, 364/419; 340/347 DD

[56] References Cited

U.S. PATENT DOCUMENTS

| | | | |
|---|---|---|---|
| 3,931,612 | 1/1976 | Stevens et al. | 364/900 |
| 4,241,402 | 12/1980 | Mayper, Jr. et al. | 364/200 |
| 4,270,182 | 5/1981 | Asija | 364/900 |
| 4,295,124 | 10/1981 | Roybal | 340/347 DD |
| 4,327,379 | 4/1982 | Kadakia et al. | 358/261 |
| 4,342,085 | 7/1982 | Glickman et al. | 364/300 |
| 4,374,625 | 2/1983 | Hanft et al. | 400/98 |
| 4,386,416 | 5/1983 | Giltner et al. | 364/900 |
| 4,409,621 | 10/1983 | Richards et al. | 354/5 |
| 4,417,319 | 11/1983 | Morimoto et al. | 364/900 |

OTHER PUBLICATIONS

"Text Compression Using a 4 Bit Coding Scheme", J. Pike, The Computer Journal, vol. 24, Nov. 4, 1981, copyright Heyden & Son, Ltd. 1981.

Primary Examiner—James D. Thomas
Assistant Examiner—A. Williams
Attorney, Agent, or Firm—Nathan Cass; Edmund M. Chung; Kevin R. Peterson

[57] ABSTRACT

Standard ASCII coded text is divided into alpha, numeric, and punctuation tokens. Each token is converted to a string of four-bit nibbles. One nibble is coded to identify the type of token. Additional nibbles are coded to identify the location, if any, of a corresponding alpha or punctuation token in a global dictionary. If no corresponding alpha token is in the dictionary, an alpha token is divided into prefixed, suffixes, and a stem. The location of any prefixes in a table of prefixes, suffixes in a table of suffixes, and the number, and location of corresponding individual characters in a table, of the remaining stem are then coded and stored as part of the string of four-bit nibbles for the alpha tokens. Numeric tokens are stored as a string of four-bit nibbles in which the first nibble identifies the type of token, the next nibble the length, followed by a nibble for each of the digits.

18 Claims, 19 Drawing Figures

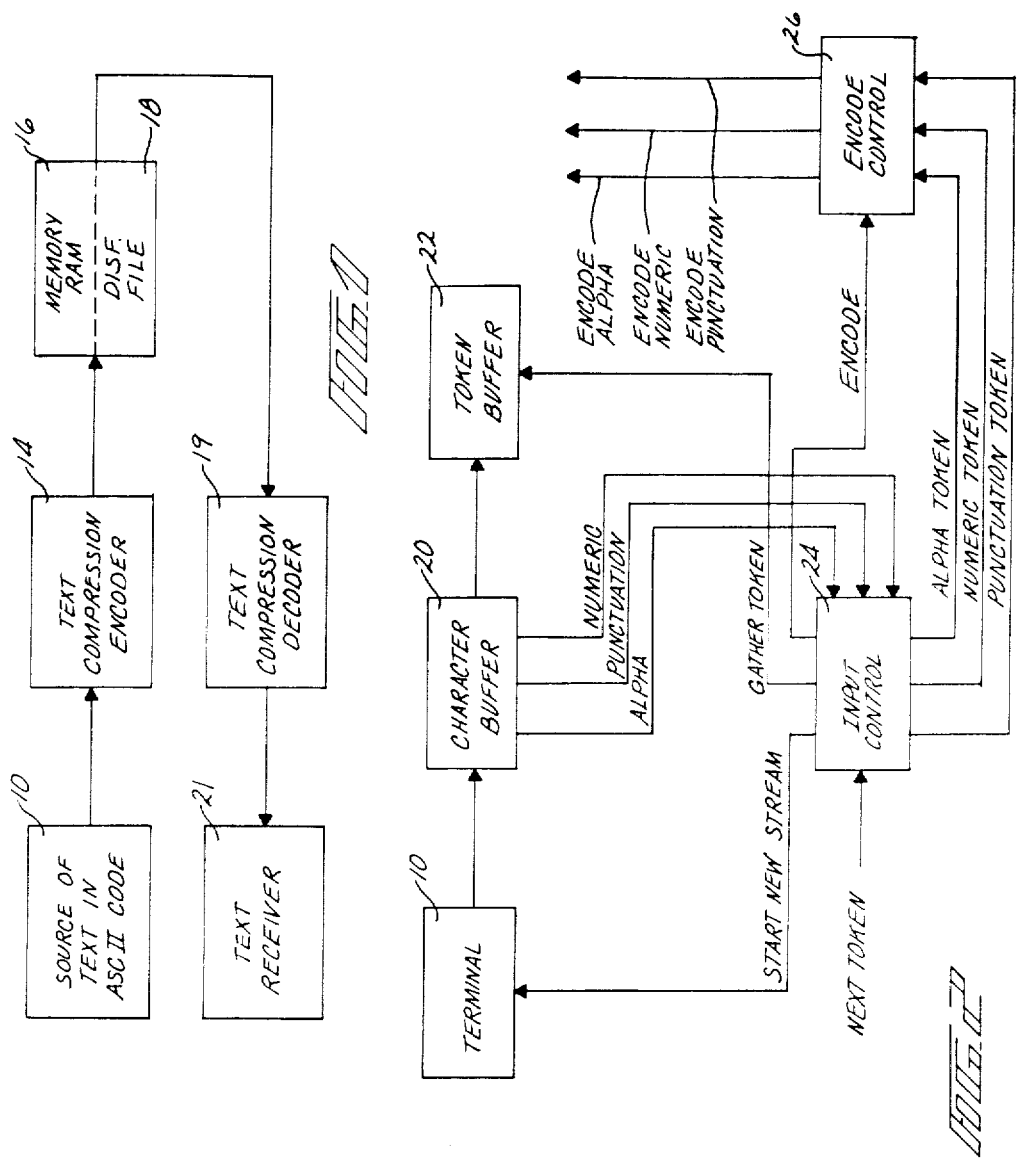

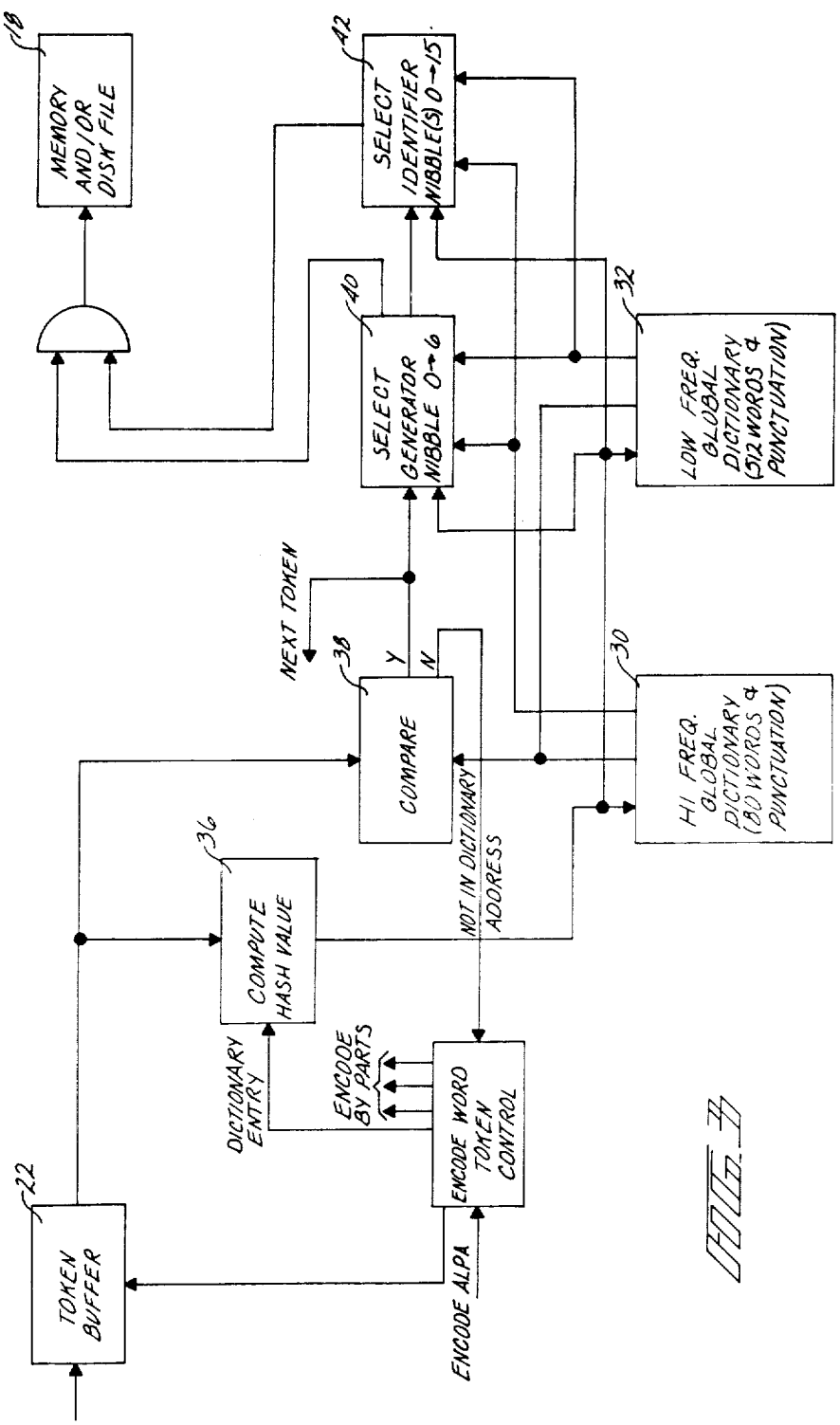

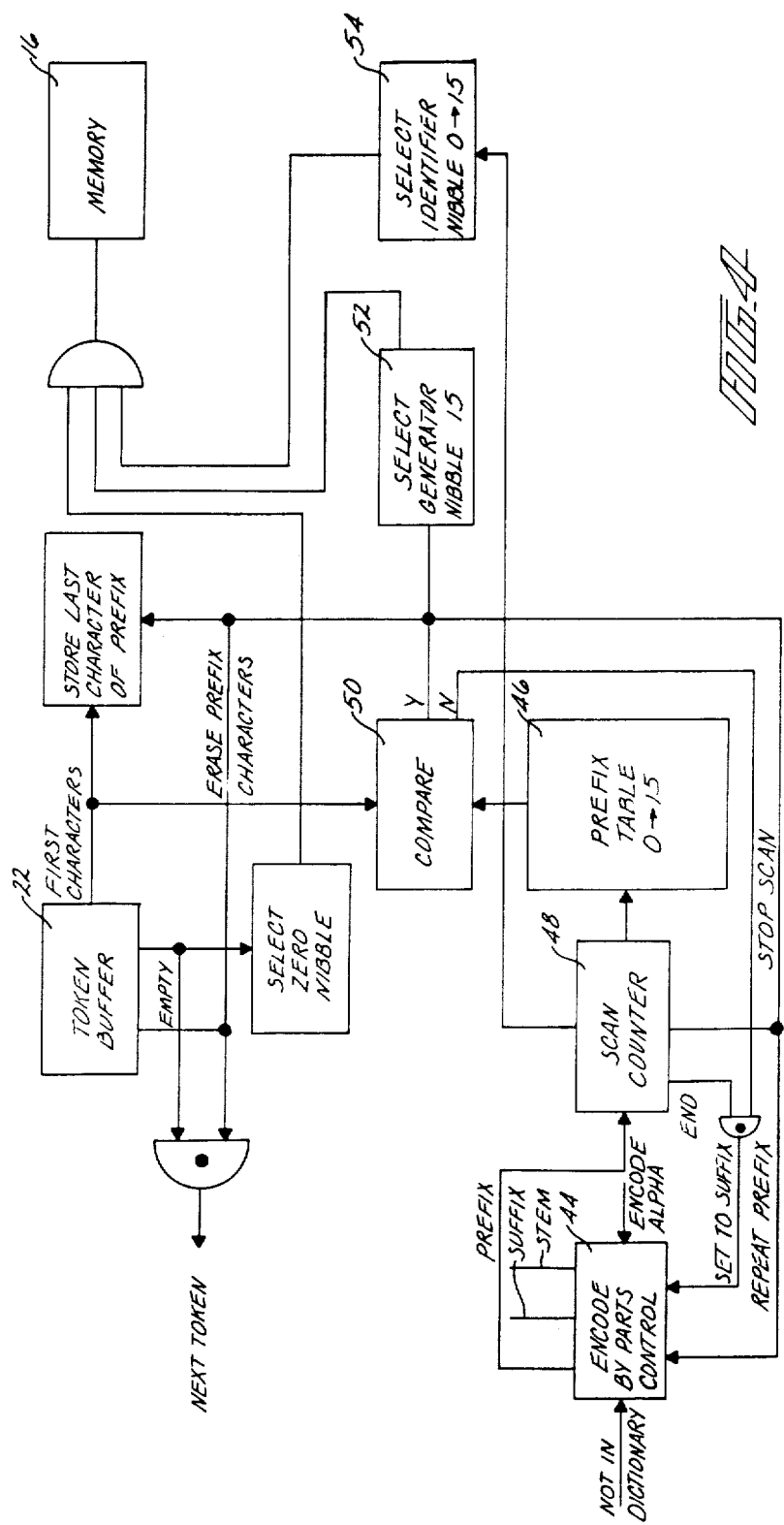

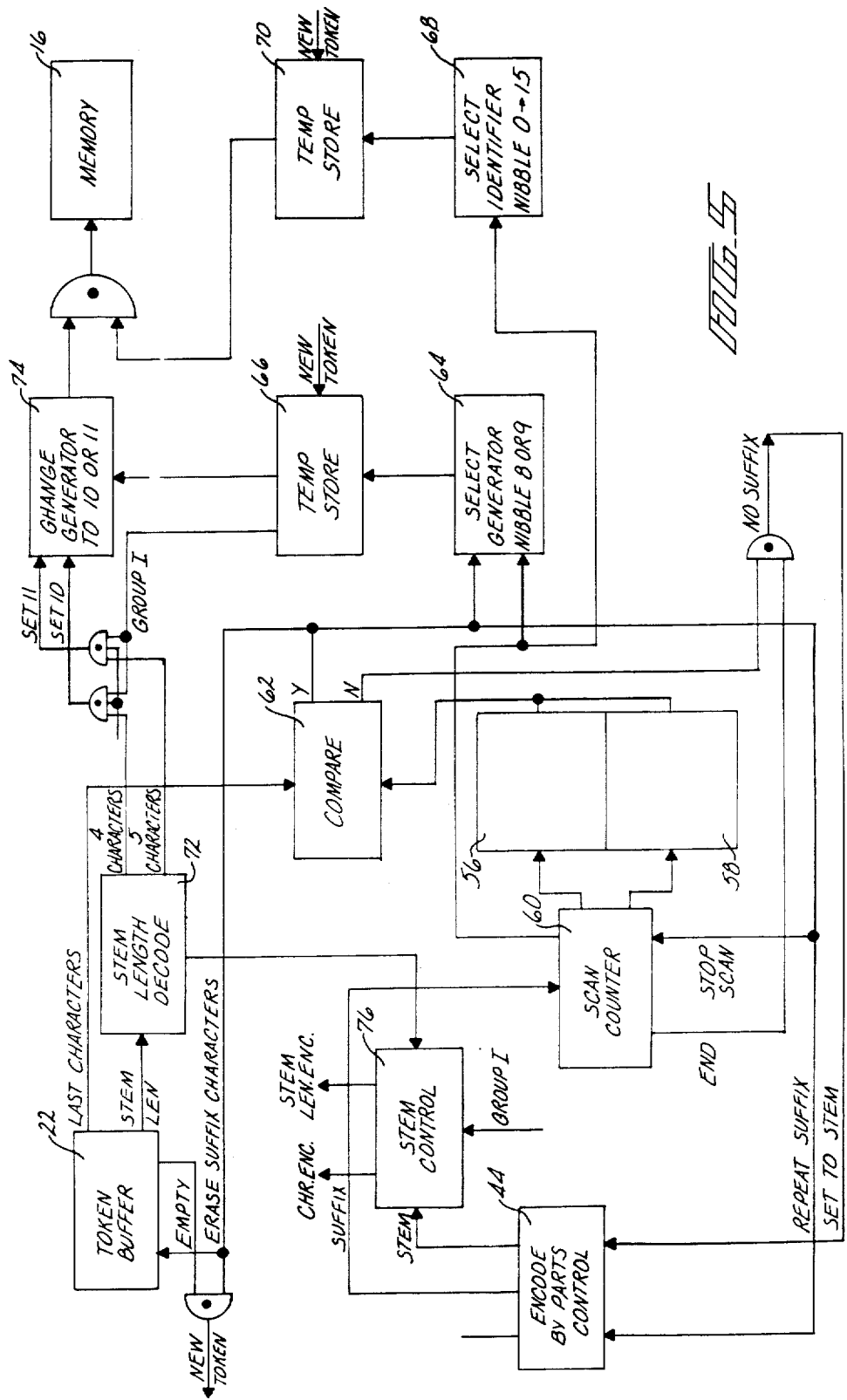

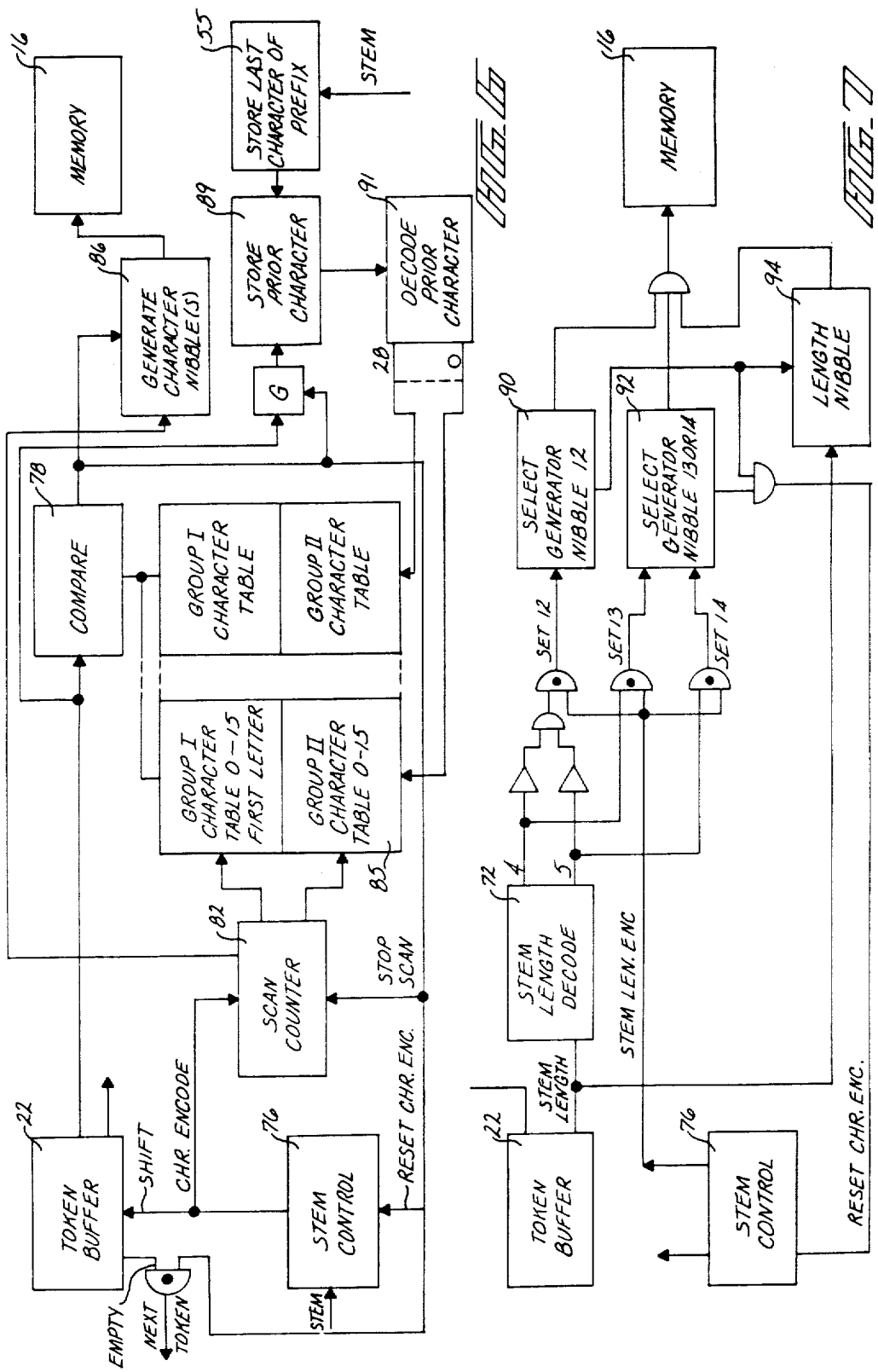

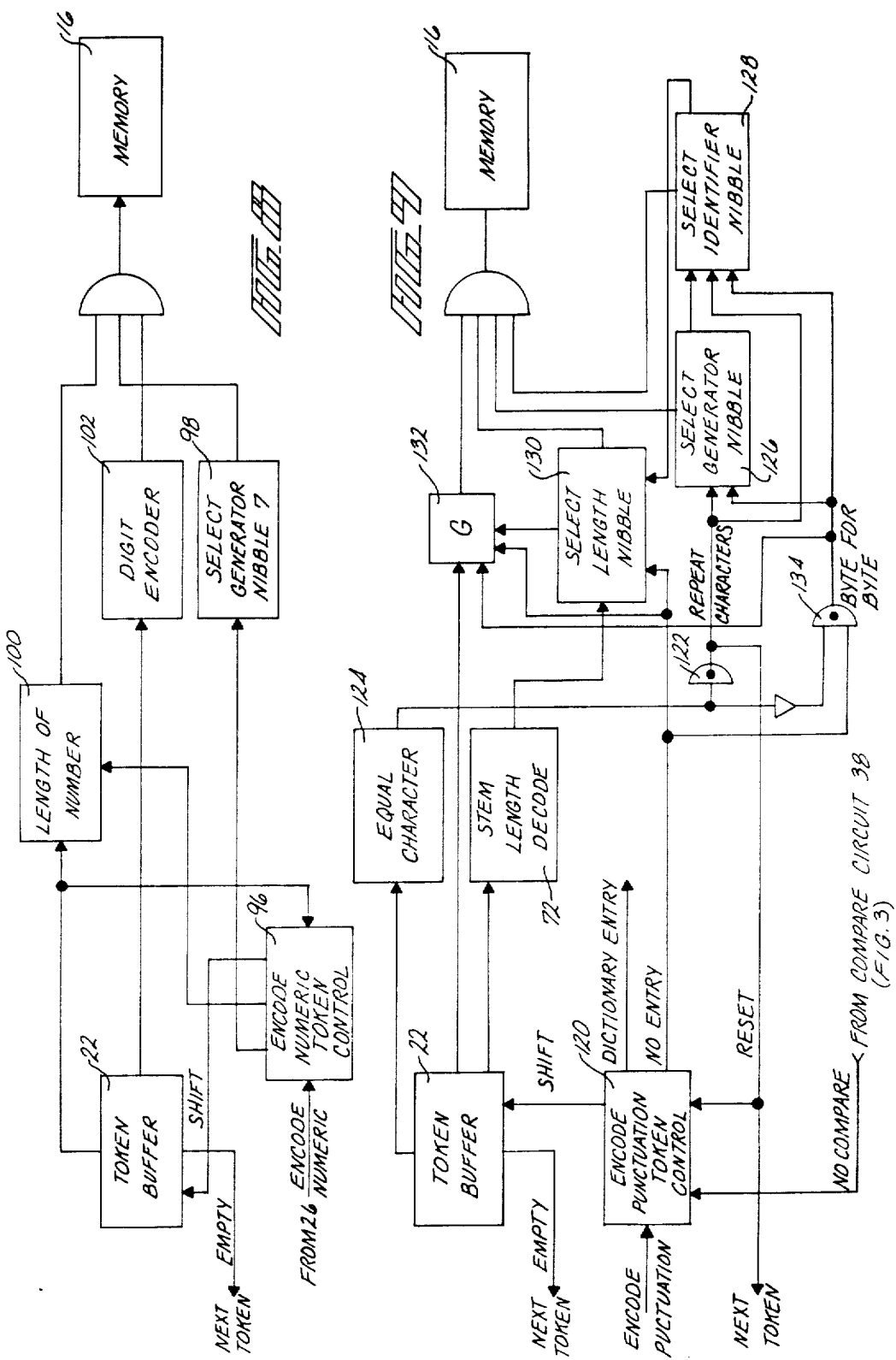

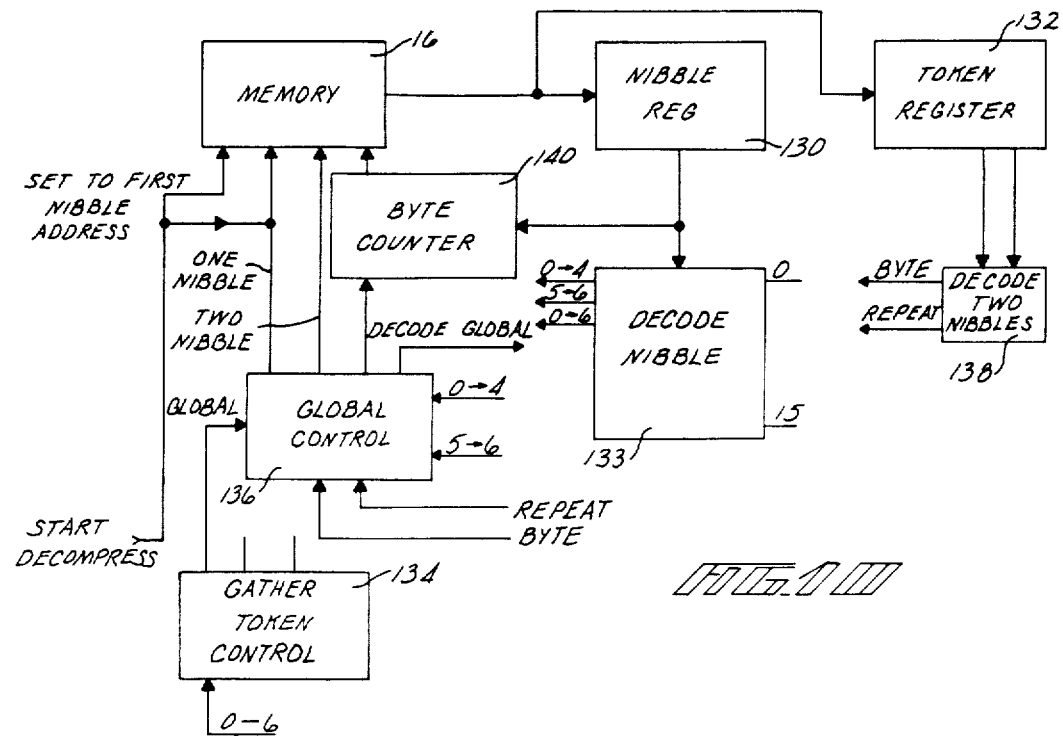
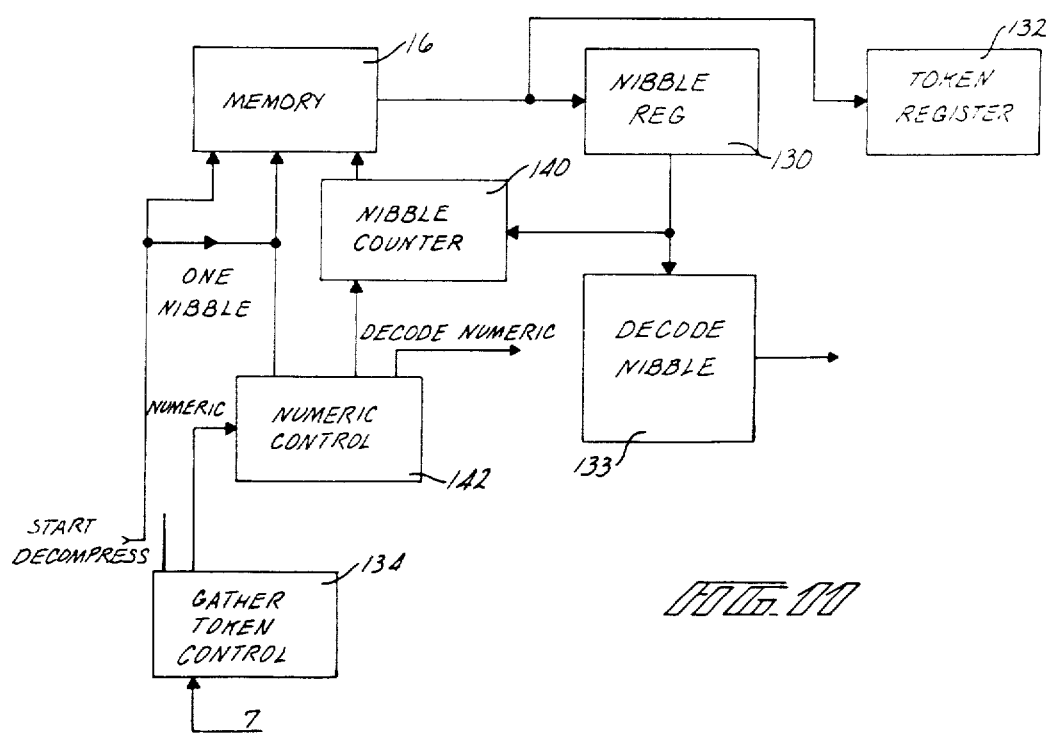

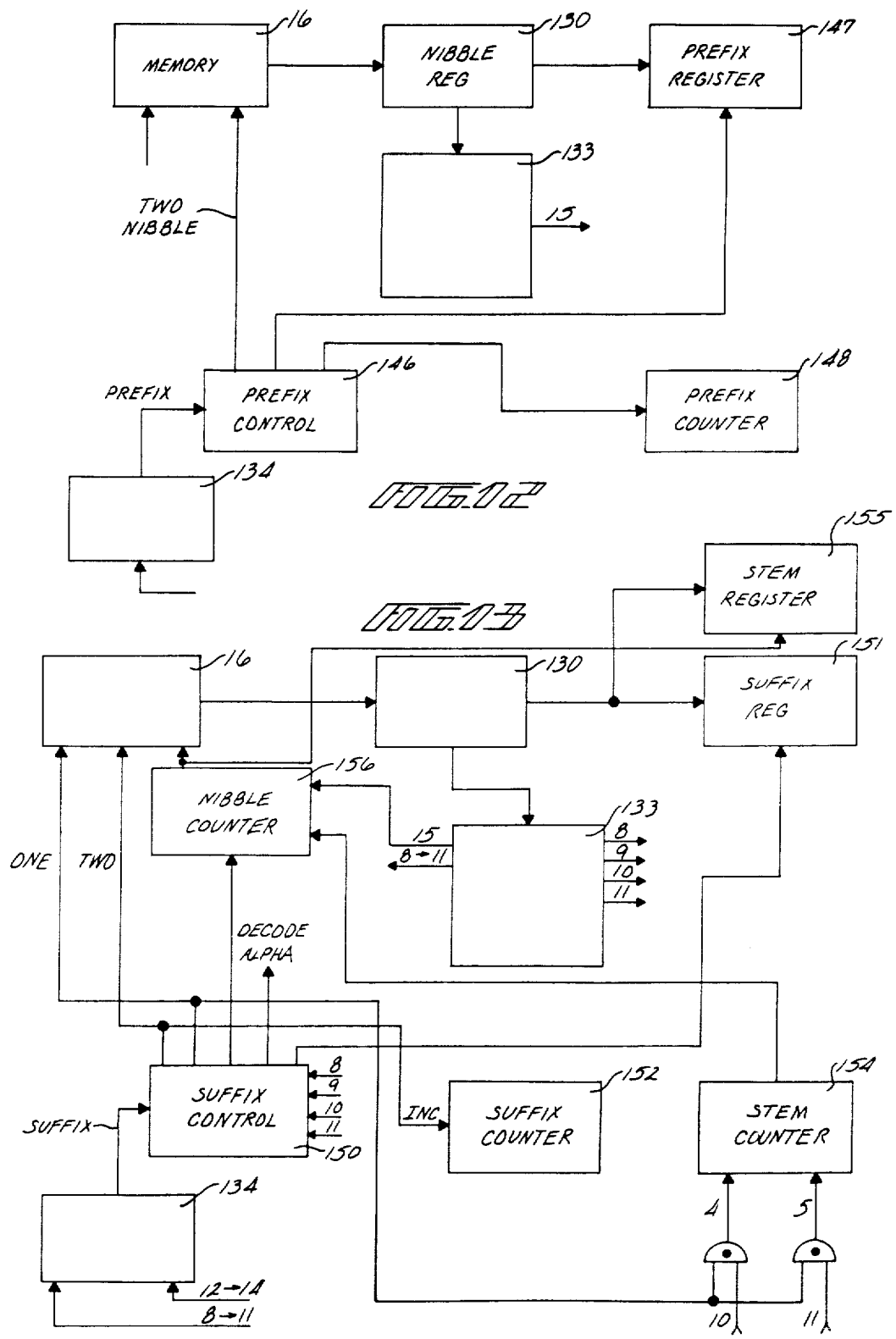

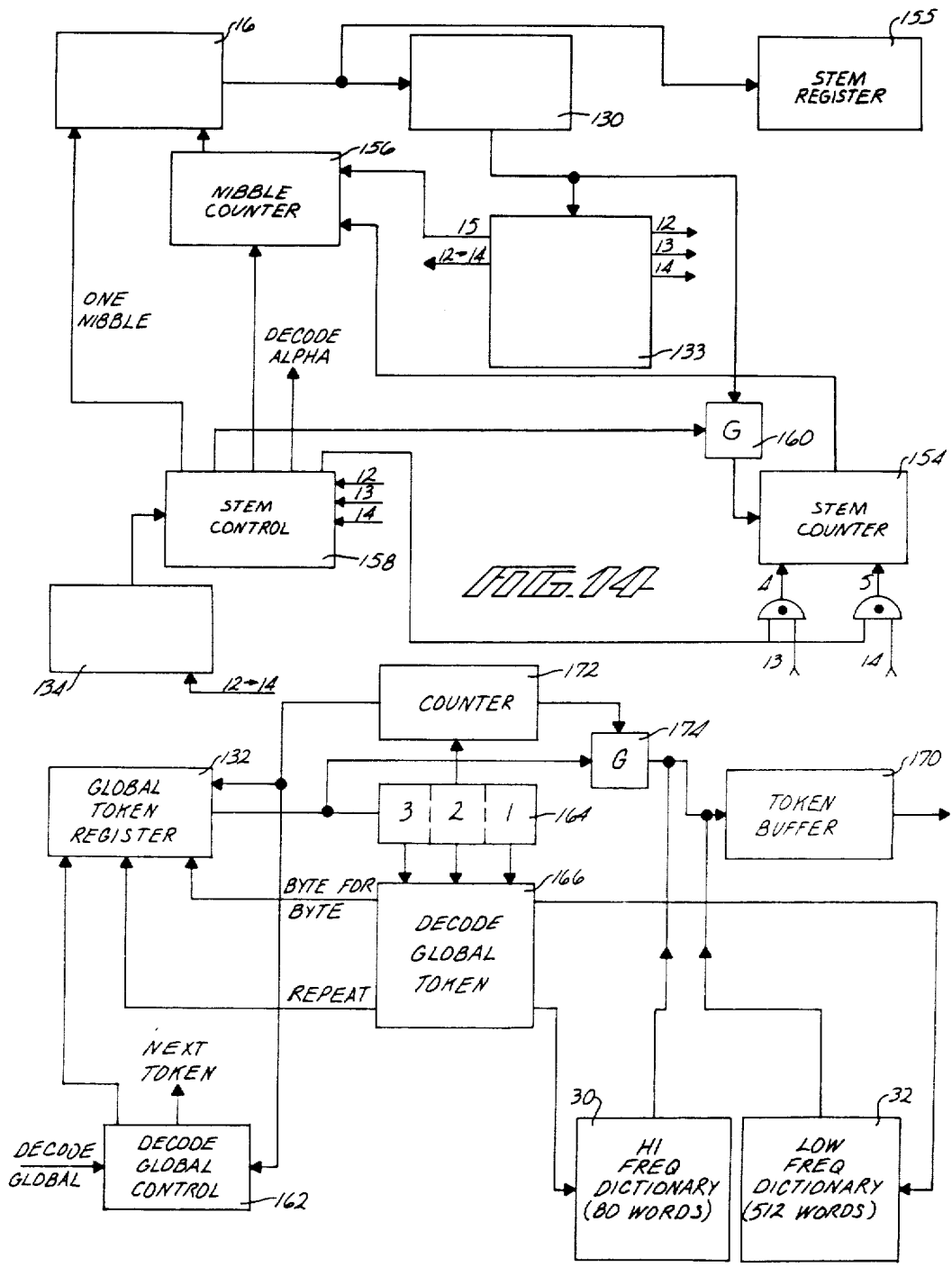

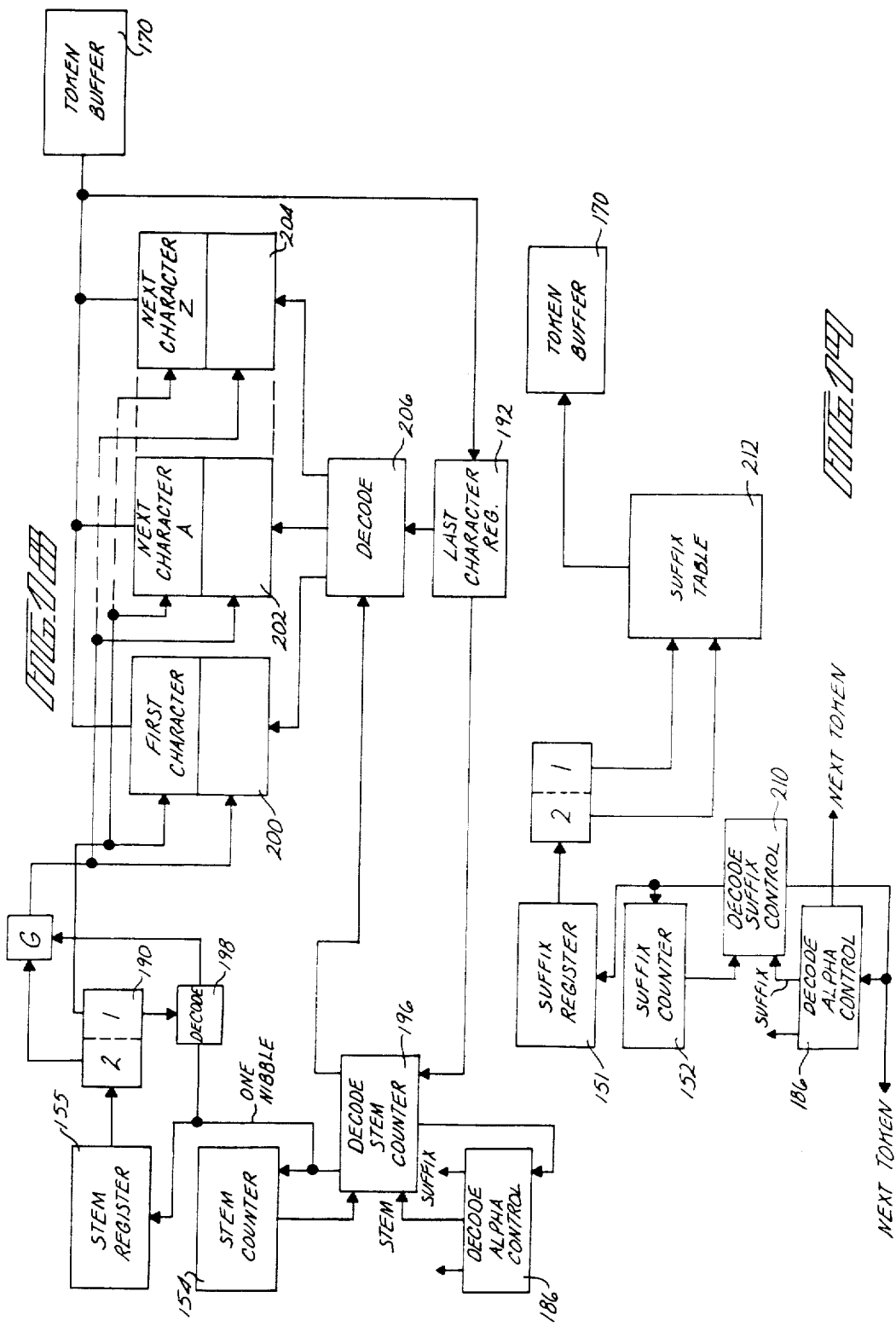

SYSTEM FOR COMPRESSED STORAGE OF 8-BIT ASCII BYTES USING CODED STRINGS OF 4 BIT NIBBLES

FIELD OF THE INVENTION

This invention relates to storage of English or other natural language text in digitally coded form, and more particularly, to a method of compressing text coded in ASCII to a much more compact coded representation of the text.

BACKGROUND OF THE INVENTION

The transmission and storage of English text in binary coded form is done in standardized ASCII code in which a set of alphanumeric characters, punctuation and other symbols and abbreviations, for example, representing beginning and end of text, carriage return and the like, are coded in eight-bit bytes. Memory storage capacity is frequently rated in terms of the number of bytes that can be stored in the memory. When it is necessary to store and access a large volume of textual information, it becomes desirable to utilize some coding scheme which compresses the amount of memory required to store the alphanumeric characters, punctuation and other symbols necessary to reproduce the textual material. While various schemes have been developed for coding textual material, such as the Huffman coding technique, such schemes have not taken full advantage of certain unique characteristics of English text while at the same time being able to handle any byte sequence as it is received.

SUMMARY OF THE INVENTION

The present invention is directed to an improved method of compressing, storing, and retrieving in decompressed form information received in ASCII coded bytes. The text is gathered in tokens, where each token is one or more characters forming a word, a number, or a punctuation sequence. Miscellaneous ASCII coded input bytes, such as spaces, tabs and other format items are encoded as punctuation tokens. However, certain punctuation such as a period or comma in a number, or a hyphen or apostrophe in a word is encoded as part of a numeric or alpha word token. The unit of encoding in the compressed text is four-bits, referred to as a "nibble". Most frequently used letters and digits are encoded in a single nibble, thus allowing two characters to be represented by a single byte and giving an approximate effectiveness of two-to-one compression. Almost six hundred words and punctuation sequences used most frequently in English text are encoded in a very compact form, using only two or three nibbles for each. This gives a potential of a compression ratio substantially better than two-to-one.

This encoding is accomplished by the compression method of the present invention in which a token is first isolated from a string of ASCII coded bytes. If the token is a word token, for example, the word is first compared with a global dictionary of the most frequently used words in the English language. If the word is present in the dictionary, it is stored as two or three nibbles. This takes care of many of the shorter words that are among the most frequently used English words. Longer words are encoded by first comparing the first several letters with a list of frequent prefix letter combinations. If present in the list, the prefix is stripped from the token and stored as two nibbles. This process is repeated on the remaining letters until the remaining front letters are not found in the prefix list. Next the ending letters are compared with a suffix list and, if present in the list, stored as two nibbles and stripped from the end of the word. If the stem length is four or five characters and a suffix was identified, the first nibble stored in response to the last suffix is changed to a value that indicates the stem is either four or five characters in length. All number tokens are stored as one nibble identifying the type of token and one nibble for each digit of the number. Punctuation tokens are encoded by including common punctuation sequences in the global dictionary, and if not in the dictionary are encoded byte for byte in ASCII Code together with nibbles indicating that the token is punctuation, byte for byte encoding, and the number of bytes in the token.

BRIEF DESCRIPTION OF THE DRAWINGS

For a better understanding of the invention, reference should be made to the accompanying drawings, wherein:

FIG. 1 is a block diagram of a digital processing system for compressing and storing textual information;

FIG. 2 is a schematic block diagram of the system for gathering tokens;

FIG. 3 is a schematic block diagram of a system for encoding word tokens using a global dictionary;

FIG. 4 is a block diagram of a system for encoding the prefixes of word tokens;

FIG. 5 is a block diagram of a system for encoding suffixes of a word token;

FIGS. 6 and 7 are block diagrams of a system for encoding the stem of a word token;

FIG. 8 is a block diagram of a system for encoding numeric tokens;

FIG. 9 is a block diagram of a system for encoding punctuation;

FIG. 10 is a block diagram of a system for gathering global tokens from memory during decompression;

FIG. 11 is a block diagram of a system for gathering numeric tokens;

FIG. 12 is a block diagram of a system for gathering prefixes into an alpha token during decompression;

FIG. 13 is a block diagram of a system for gathering suffixes into an alpha token during decompression;

FIG. 14 is a block diagram of a system for gathering a stem into an alpha token during decompression;

FIG. 15 is a block diagram of a system for decoding a global token;

FIG. 16 is a block diagram of a system for decoding a numeric token;

FIGS. 17, 18, and 19 are block diagrams of a system for decoding a word coded as prefixes, a stem, and suffixes.

DETAILED DESCRIPTION

Figure 17:
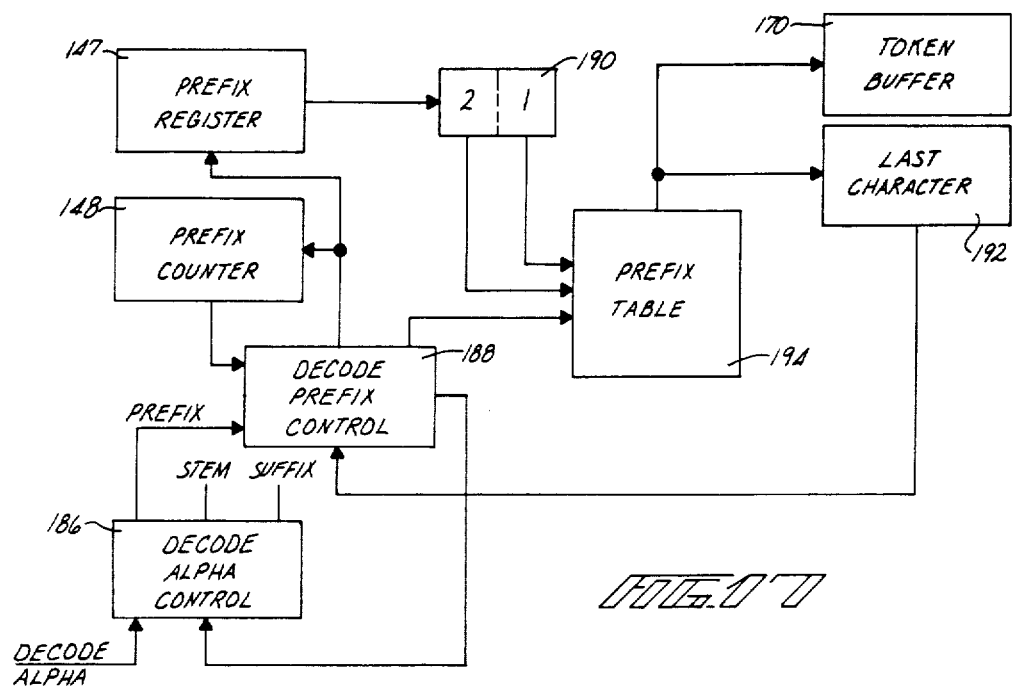

The text storage system includes some type of input terminal 10, which may be a keyboard, a modem or other device which sends data over an input bus in standard ASCII coded bytes. The source of the ASCII coded text is immaterial to the invetion. A text compression encoder 14 modifies the data into a compressed form for storage in a random access memory 16 and/or a disc memory 18. The stored data from the disc memory 18 and/or the RAM 16 is decompressed by a text compression decoder 19 back into a standard ASCII code format for transmission to a text receiving terminal 21.

When operating in the compression mode, the test compression encoder 14 initiates the transfer of data, a character at a time, from the terminal 10 over the input bus. Each character is stored temporarily in a character buffer 20 where it is decoded to determine whether it is a numeric character, an alpha character or a punctuation character. For this purpose, all miscellaneous input bytes, including spaces, tabs and other format items, are decoded as punctuation characters. The succession of characters as received are grouped into separate tokens. The delineation between tokens is recognized by a change from one of these three types of characters to another of said three types. Thus an alpha word is normally followed by a space, which is recognized as a punctuation character delinating an alpha token. However, a space need not be encoded as a separate punctuation token during compression, but may be treated as a default condition and inserted automatically between successive alpha words during decompression. A series of punctuation characters, a series of numeric characters or a series of alpha characters are thus delineated as single tokens.

The characters constituting a single token are gathered in a token buffer 22 in response to an input control 24 which first starts a new string of characters from the input terminal, recognizes a change in the nature of the character transferred to the character buffer from one type to another, for example, from a space character to an alpha character, and causes the successive characters to be gathered in the token buffer. Once the end of a token transferred to the buffer is recognized, the input control 24 initiates an encoding procedure for compressing the token before storing it in the RAM 16 and/or disc memory 18. An encode control 26 is signaled by the input control 24 when the token buffer is filled with a token and determines whether the token is an alpha token, a numeric token or a punctuation token. The encode control 26 then signals an alpha encoding operation or a numeric encoding operation or a punctuation encoding operation.

The encoded information stored in memory after compression takes the form of a sequence of nibble strings, each nibble string corresponding to one token. A nibble is four binary bits and so may be coded to any one of sixteen possible values. All encoding to achieve compression according to the concept of the present invention involves generating a first nibble called a generator, which indicates the type of encoding for the associated token or part of a token. The 16 possible types of encoding identified by the first nibble are as follows:

| First or Generator Nibble | Type of Encoding | Remainder of Encoding |
| --- | --- | --- |
| 0 . . . 4 | high frequency global | one identifier nibble (80 globals) |
| 5 . . . 6 | medium frequency global | two identifier nibbles (512 globals) |
| 7 | numeric | count (0-15) plus digit codes |
| 8 | suffix ending, group 2 | suffix identifier code, more information |
| 9 | suffix ending, group 1 | suffix identifier code, more information |
| 10 | suffix group 1 on stem size 4 | suffix identifier code, 4 letter codes |
| 11 | suffix group 1 on | suffix identifier code, |

-continued

| First or Generator Nibble | Type of Encoding | Remainder of Encoding |
| --- | --- | --- |
| | stem size 5 | 5 letter codes |
| 12 | stem with count | count (0-15) plus letter codes |
| 13 | stem of size 4 | 4 letter codes |
| 14 | stem of size 5 | 5 letter codes |
| 15 | prefix beginning | prefix identifier code, more information |

All 16 types of encoding are used for encoding of alpha tokens except for the generator value 7, which is reserved for encoding of number tokens. Generators 0 to 6 are also used for encoding punctuation tokens. Assuming that a token is stored in the buffer 22 which is identified as an alpha or word token, the first step is to determine whether the word is stored in either a high frequency global dictionary or a low frequency global dictionary. A high frequency global dictionary 30 consists of up to 80 of the most common words and punctuation combinations appearing in English text. The table may be stored in a read-only memory, for example. In addition, a low frequency global dictionary, consisting of up to 512 English words and punctuation combinations, is stored in a read-only memory 32. An encode word token control 34, in response to an encode alpha signal from the encode control 26, initiates a comparison between the word stored in the token buffer 22 and the contents of the high frequency global dictionary and the low frequency global dictionary. While this can be done by comparing each entry in the dictionaries in sequence with the token, it is preferable to use a well-known addressing technique in which a value that is uniquely related to the combination of characters in the token in the buffer, referred to as a hash value, is first computed by a conventional algorithm. This value is then used as an address to the dictionaries. Thus, by storing each word in the dictionaries at an address that corresponds to its computed hash value and using the hash value of the word stored in the token buffer 22, a word having the corresponding hash value can be addressed in the global dictionaries. A comparison is then made by a compare circuit 38 between the stored word addressed by the hash value with the word being encoded. If more than one word in the dictionary has the same hash value, these words are stored in sequence and a comparison is then made on each of these words in sequence. If a match is found, the next token is gathered in the buffer 22. At the same time a generator nibble and one or two identifier nibbles are selected and stored in the memory 16 or disc file 18 following the generator nibble. The generator and identifier(s) nibbles uniquely define the token and, as hereinafter described in detail, can be used to retrieve the token word from the dictionaries during decompression. The generator and identifier nibbles are selected by using the encoding type values 0 through 4, together with an identifier value of 0 through 15, to uniquely address the 80 words in the high frequency global dictionary table. The generator values 5 and 6, together with two identifier nibbles, each of value 0 through 15, uniquely address any one of 512 words in the low frequency global dictionary 32.

Thus it will be seen that if a token word being compressed is found in the high frequency global dictionary, only two nibbles are stored in the memory in place of the full word. A 6-letter word, for example, which would normally require 6 bytes of memory to store in full ASCII code, is compressed into a single byte (two nibbles) of memory. If the word is in the low frequency global dictionary, it is compressed to 1½ bytes (three nibbles) of memory. In either case, there is a very sizable reduction in memory required to store the token information.

If the compare circuit 38 indicates that there is no match between the word token in the buffer 22 and any of the words stored in the global dictionaries 30 and 32, it signals the encode word token control 34 to initiate an alternate encoding procedure in which the word is encoded in parts, as represented by the generator values 8-15 in the above table. The token is broken down into identifiable beginning letter combinations, called prefixes, identifiable ending letter combinations, called suffixes, and a central or middle letter combination, called a stem. As shown in FIG. 3, if the compare circuit 38 indicates the token is not in the global dictionaries, it activates an encode-by-parts control 44 which, as shown in FIG. 4, first initiates a prefix encoding operation in which the first two or three letters of the word token in the buffer 22 are compared with 16 different letter combinations stored in a prefix table 46. The table comprises the most common letter combinations found at the beginning of English words, such as set forth in the following table:

WORD BEGINNINGS com
con
co
de
ex
in
pro
re
se
sh
sta
st
su
te
to
un

The prefixes are scanned in the table in sequence by a scan counter 48 and compared by a compare circuit 50 with the corresponding number of beginning characters in the token word stored in the buffer 22. If the scan of the prefix table is complete and no match is found, a set-to-suffix signal is applied to the encode-by-parts control 44 to terminate the prefix encoding operation. However, if a match does occur, the scan counter is interrupted and a repeat prefix signal is sent to the encode-by-parts control 44. The last character of the prefix is temporarily stored in a register 55. Also, the first group of prefix characters are erased from the token word stored in the buffer 22. The generator nibble 15 is selected, as indicated at 52, and recorded as the first or generator nibble of the compressed token string stored in the memory 16. This is followed by a selected identifier nibble, as indicated at 54, which identifies which of the sixteen prefixes in the table 46 was stripped from the token word. Thus the two nibbles stored in memory can be used to generate the first two or three characters of a token during the retrieval or decompression operation.

Once the first prefix is stripped from the token, the operation is repeated using the first of the remaining characters of the word in the buffer 22 for comparison. If a second match is achieved, another generator nibble and identifier nibble are stored in sequence in the memory 16. This operation is repeated until either all of the letters of the word token have been erased and the buffer 22 is empty, in which case the next token is gathered, or no match exists with the first letters of the word in the buffer and the contents of the prefix table 46, in which case the the encode-by-parts control 44 is set to initiate a suffix encoding operation. If there are no letters left in the token, a stem length of zero is stored as the last nibble of the encoded token in memory. It should be noted that a nibble value of 0 to 7 following any prefix or suffix generator and identifier is interpreted as a stem length value.

Referring to FIG. 5, suffix encoding involves two suffix tables referred to as Group I and Group II, indicated at 56 and 58. Group I table involves sixteen of the most common word endings found in the English language while Group II comprises an alternate set of 16 less common word endings. An example of the contents of suffix tables 56 and 58 is given in the following table:

| WORD ENDINGS | ALTERNATE WORD ENDINGS |
|---|---|
| al | age |
| ed | ally |
| en | ct |
| ent | ght |
| er | ies |
| ers | ion |
| es | ity |
| ic | ment |
| ing | ments |
| ly | nce |
| ry | ns |
| se | th |
| st | ther |
| ted | tions |
| tion | ure |
| ts | 's |

Single letter word endings are not used in these tables, because special encodings for single letters would not aid compression.

The tables are listed, alphabetically but it will be understood that the order in which the suffixes are scanned and compared may be different so that a larger suffix ending in the same letters as a shorter suffix is compared first, in order that comparison proceed from the more specific to the more general.

A scan counter 60 scans the word endings in the two tables in sequence, comparing each of the endings in the tables with the corresponding number of ending characters in the word token stored in the buffer 22. A compare circuit 62, when it finds an affirmative comparison, stops the scan counter 60 and signals the encode-by-parts control 44 to repeat the suffix encoding. At the same time, the compare circuit causes the selection of a generator nibble 8 or 9, as indicated at 64. A 9 is selected if the match is made from the Group I suffix table, as indicated by the status of the scan counter 60, or a nibble 8 if the comparison is with a suffix found in the Group II suffix table 58. The generator nibble, whether it is an 8 or 9, is then stored in a temporary store 66. Next an identifier nibble is selected, as indicated at 68, and transferred to a temporary store 70. Thus the generator and identifier nibbles identify a suffix as being in Group I or Group II as well as the particular suffix in the group. The suffix characters are erased from the end of the word token in the buffer 22, and the suffix encoding operation is repeated on the remaining last characters of the word token. If a second match is found, the generator and identifier nibbles are selected and transferred to the temporary stores 66 and 78. At the same time the previously stored suffix generator and identifier nibbles are transferred in sequence to the nibble string in the memory 16.

If a match is found and the token buffer 22 is emptied by the erasing of the corresponding suffix characters, the encoding operation is complete and a new token is gathered. At the same time, the generator nibble and identifier nibble produced in the temporary stores 66 and 78 for the final suffix are transferred to the memory 16 or disc file 18.

If no match is found between the last ones of the remaining characters in the token buffer 22 and the word endings in the suffix tables, the encode-by-parts control 44 is advanced to the stem encoding stage. At the same time, the number of letters or characters remaining in the buffer 22 are decoded by a stem length decode circuit 72. If the generator nibble in the temporary store is a 9, indicating a Group I suffix, it is changed to a 10 or an 11, if the stem length decodes as four characters or five characters in length. Thus the generator for the last suffix identified, if it is a 9, is changed to a 10 or to an 11 before it is transferred to the memory 16.

At the completion of the suffix encoding operation, the characters or letters remaining in the token buffer 22 represent the stem of the token. If there was at least one suffix, and if the last suffix stripped was from Group I, and the remaining stem was four characters or five characters in length, the length of the stem is already stored in the memory in the form of a 10 or an 11 stored as the generator nibble of the suffix. All that remains to complete the encoding of the token is to encode the individual four or five characters of the stem remaining in the token buffer 22. This operation is initiated by stem control 76 which recognizes that the stem length is a four or five and that a Group I generator 9 was selected for the temporary store 66. The stem control 76 then initiates a character encoding operation. Since there are 26 letters plus an apostrophe and a hyphen which are used as characters in a word token, one nibble is used to encode 15 of the most frequently used characters, and two nibbles are used to encode the remaining characters. One value, e.g., 15, of the first nibble is reserved to identify that the following nibble is or is not needed to encode the character. Since the frequency of a letter in an English word depends on whether it is used as the first letter of a word, or follows a particular letter, it is desirable to have a separate set of Group I and Group II characters for beginning letters and for following each of the possible twenty-eight characters. As shown in FIG. 6, the first letter table is indicated at 85. The last of the other twenty-eight tables is indicated at 87. A register 89 is used to store the previous character. For the first letter of the stem, the prior character is received from the register 55, which stores the last character of the prefix, if a prefix was found. As each stem character is shifted out of the token buffer 22, it replaces the prior character in the register 89. The character in the register 89 is used to select one of the sets of tables, as indicated at 91.

As shown in FIG. 6, when the stem control 76 initiates a character encoding operation, it causes the first character of the stem to be shifted out of the token buffer 22 to a compare circuit 78 which compares the character with a Group I set of characters in the selected one of the tables 85–87. The table is scanned by scan counter 82. If no comparison is found, the scan counter 82 continues to scan the Group II character table. When a comparison is found, the scan counter is interrupted, and based on the setting of the scan counter, one or two character nibbles are generated, as indicated at 86, and transferred to the memory 16. The stem control 76 is reset for another character encoding operation and the next character is shifted out of the token buffer 22. When all of the characters have been shifted out of the token buffer 22 and the token is fully encoded, the next token is gathered in the manner discussed above in connection with FIG. 2.

If the stem length was not encoded during the suffix encoding operation described above in connection with FIG. 5, the next nibble to be stored in memory is used to identify the length of the stem.

If the last suffix is not a Group I suffix, the stem control 76 initiates a stem length encoding operation, as shown in FIG. 7. If the stem length is less than 8, and if at least one prefix or suffix was stripped as indicated by the "affix flag set" at 87, then the stem length is encoded as a single nibble at 94. Otherwise, if the stem length is not four or five, the output of an AND circuit 88 activates a circuit 90 to select generator nibble 12 which is transferred to the memory 16. If the stem length is a four or a five, a generator nibble of either 13 or 14 is transferred to the memory 16 which selects generator nibble 13 or 14 by a circuit 92. If a 12 operator is transferred to memory, indicating that the stem length is not 4 or 5, a nibble coded to identify the length of the stem is generated, as indicated at 94, and transferred to the memory 16. The stem control 76 is then reset to the character encoding operation described above in connection with FIG. 6, which causes the individual characters of the stem to be encoded and the nibbles transferred to the memory 16.

This completes the operation of text compression encoder 14 for storing word tokens in memory. Numeric tokens are compressed and stored in the manner shown in FIG. 8. An encode numeric token control 96 first selects the generator nibble value 7 and stores it in the memory, as indicated at 98. It then stores the number of digits in the number stored in the token buffer 22, as indicated at 100. The encode numeric token control 96 then causes each of the digits in sequence to be shifted from the token buffer 22 to a digit encoder 102 which converts from the ASCII code for each of the 10 possible digits to a corresponding 4-bit nibble, which is then stored in the memory 16. When all of the digits are shifted out of the token buffer 22, gathering of the next token is initiated.

Encoding of punctuation tokens is shown in detail in FIG. 9. As noted above, punctuation tokens include all the ASCII characters that fall outside of words and numbers, such as common punctuation marks, spaces, tabs, end of line sequences, form feeds, capitalization, underlining and the like. The more common punctuation sequences, for example, such combinations as a comma followed by a space, a period and space, a period followed by two spaces and a capitalization of the next letter, a semicolon and a space, etc., are included in the high frequency and low frequency global dictionaries. Assuming a punctuation token has been gathered in the buffer 22, an encode punctuation token control 120 first initiates a dictionary lookup operation which is identical to the dictionary lookup operation for a word token, as described above in connection with FIG. 3. If the punctuation combination is not present in the dictionary, the compare circuit 38 (see FIG. 3) indicates there has been no match. This causes the encode punctuation token control 120 to indicate a no entry condition. Encoding of the token then proceeds in either of two modes, a repeat character mode or a byte-for-byte mode. The repeat character mode is used if the punctuation token consists of a group of identical characters, such as all spaces, all dashes, all underscore characters or the like. In this case a generator nibble and an identifier nibble followed by a nibble indicating the number of repeat characters followed by the character itself are stored in sequence in the memory 16. An AND circuit 122 determines that no dictionary entry occurred and that the characters in the token buffer are equal, as indicated at 124. It then activates a select generator nibble circuit 126 followed by a select identifier nibble circuit 128 and a select length nibble circuit 130 and finally gates one character from the token buffer as a full ASCII byte to the memory 16. The output of the AND circuit 122 then signals for the next token to be gathered.

Alternatively, an AND circuit 134 is activated when the characters in the token buffer are not equal and initiates a byte for byte transfer of all of the characters from the token buffer 22 to the memory 16 after transferring a generator nibble and an identifier nibble and length nibble to the memory 16. Thus all of the characters in the token buffer 22 are transferred byte-for-byte in ASCII code to the memory 16 without compression. The generator nibble selected is a predefined value from 0 to 6 and the identifier nibble is a predefined value from 0 to 15. The generator and identifier values point to an address in the global dictionary which is not used for storing a word or punctuation combination. The particular generator and identifier values are recognized on decompression as indicating a repeat character or a byte-for-byte operation.

From the above description, it will be seen that all English text can be divided into tokens which are either words, numbers or punctuation and other miscellaneous ASCII coded characters. Each token is stored as a string of nibbles. Contained within each string of nibbles is sufficient information to determine the length of the string in memory and to reconstruct the ASCII coded information represented by the string of nibbles. Compression results from recognizing that English text does not consist of random characters but rather is structured according to certain rules which make it possible to reduce the amount of information that needs to be stored in memory in order to reconstruct the text. This process results in substantial saving in the amount of memory required to store the information. No provision for upper and lower case has been described, but one way of handling case is to encode both upper and lower case letters in a word token the same. Upper case letters in word tokens may be identified on decompression by the punctuation preceeding the word. For example, a common sequence is a period, followed by two blanks, and a capital starting the next sentence. This is encoded as a single punctuation combination in the dictionary table. On decompression this punctuation combination causes the first letter of the following word to be coded in upper case ASC11 character.

To reconstruct the English text from the stored information, a decompression process is provided by the text compression decoder 19 in FIG. 1. The decompression process requires that the strings of nibbles first to be gathered into individual tokens which are then decoded into ASCII coded text using the information stored in the string of nibbles. Referring to FIG. 10, a start decompress signal causes the first nibble to be read into a nibble register 130 and into a token register 132. The first nibble is decoded and if it is a 0 to 6 generator, a gather token control 134 is set to initiate a gather global token operation. This activates a global control 136 which then causes one or two more nibbles to be read out of memory depending on whether the first nibble is a 0 to 4 generator or a 5 to 6 generator, indicating a high frequency or low frequency dictionary entry. With these one or two nibbles transferred to the token register 132, a decode circuit 138 decodes them to determine whether a byte-for-byte operation is called for, or a repeat character operation is called for, or neither. If a repeat character operation is called for, the global control 136 causes the next two nibbles in memory to be transferred to the token register 132, completing the global token gathering operation. If a byte for byte operation is called for, the global control 136 causes another nibble to be read out of memory into the token register 132 and the nibble register 130. The value of the nibble in the register 130 is then used to control a byte counter 140 which transfers a sequence of bytes from the memory 16 to the token register, the number of bytes being determined by the nibble value in the nibble register 130. With the token register 132 loaded with all the nibbles for a global token, the global control 136 signals a decode global operation.

If the first nibble read out of memory is decoded by the decode nibble circuit as a 7 identifying a numeric generator, the gather token control 134 is set to signal a numeric gather operation. This activates a numeric control 142 which causes the next nibble in the memory 16 to be transferred to the nibble register 130 and token register 132. The numeric control 142 then activates the byte counter 140 which causes a sequence of nibbles to be transferred from memory to the token register 132 corresponding to the value of the second nibble stored in the nibble register 130. This completes the transfer of the numeric token to the token register 132. The numeric control 142 then signals a decode numeric operation.

If the first nibble in the register 130 is decoded as a 15, indicating a prefix generator, the gather token control 134 is set to initiate a prefix gather operation. The prefix control causes two more nibbles to be transferred from the memory 16, the second nibble of the two remaining in the nibble register 130 where it is decoded. The prefix control 146 also increments a prefix counter, indicating that one prefix generator and identifier have been transferred to the token register 132. If the third nibble in sequence, as now stored in the nibble register 130, is decoded again as a 15, the prefix control 146 repeats the operation to put another pair of nibbles in the register 130 and advances the prefix counter 148. The prefix gathering operation continues until the nibble in the register 130 corresponds to some other type generator, indicating either a suffix, generator types 8–11, or a stem, generator types 12–14. If a generator 0 is decoded, of course, the token gathering is complete and token decoding is initiated.

Assuming that the next generator decodes as an 8 to 11, the gather token control 134 activates a suffix control 150. If the decoded nibble corresponds to a generator 8 or 9, indicating respectively a Group II suffix ending or a Group I suffix ending, the suffix control transfers the next two nibbles from memory to the register 130. As each nibble of the suffix is transferred to the register 130, the prior nibble goes to a suffix register 151. The first of these two nibbles, of course, is the identifier for the first suffix plus the following generator which is stored in the nibble register 130. This nibble could be the generator for another suffix or the generator for the stem. At the same time, the suffix control 150 increments a suffix counter 152, indicating that one suffix has been transferred to the suffix register 151. If the next generator is of a value 8 or 9, the suffix control 150 repeats the above operation, incrementing the suffix counter 152 to indicate that two suffix generators and identifiers have been stored in the suffix register 151. If the generator is a 10 or an 11, the suffix control 150 causes a stem counter 154 to be set to 4 or 5, depending on whether the generator is a 10 or an 11. The suffix control 150 then causes the identifier nibble plus four or five additional nibbles (or nibble pairs) corresponding to the stem characters, to be transferred to a stem register 155. This is accomplished by a nibble counter 156 controlled by the stem counter 154. As each nibble of the stem is transferred to the register 155 and the buffer register 130, it is decoded. If the nibble has a value 15, indicating that an additional nibble is required to decode to the corresponding ASCII character, a second nibble is transferred from memory to the register 155 without advancing the nibble counter 156. Thus four or five nibbles or nibble pairs are transferred to the stem register 155 from memory 16. The suffix control 150 then calls for a decode alpha operation.

If the next operator following a suffix operator and identifier transferred from memory 16 to register 130 is decoded as a 12, 13, or 14 by the nibble decode circuit 133, the gather token control 134 is set to initiate a stem gather operation. See FIG. 14. This activates a stem control 158. If the generator value is a 12, the stem control causes the next nibble to be transferred from memory 16 to the stem register 155 and the nibble register 130. This nibble has been coded to identify the number of characters in the stem and is transferred through a gate 160 to the stem counter 154. The stem control 158 then activates the nibble counter 156 to transfer the corresponding number of nibbles or nibble pairs from the memory 16 to the stem register 155. The stem control then signals a decode alpha operation.

If the generator is decoded as a 13 or 14, the stem counter 154 is set to 4 or 5. The stem control then activates the nibble counter 156 to transfer the corresponding number of nibbles or nibble pairs to the stem register 155.

Once a global token, numeric token or the prefix, suffix and stem registers are loaded with the parts of an alpha token, the stored token nibbles are decoded to form the token in ASCII coded form. As shown in FIG. 15, if the global control 136 (see FIG. 10) signals for a decode global operation, a decode global control 162 causes the first three nibbles in the token register 132 to be shifted to a temporary storage register 164. The global token is decoded by a decode global token circuit 166 which determines whether the first nibble is a 0 to 4 or a 5 to 6 value. If the former, the decode global token circuit 166 uses the first two nibbles to address one of the 80 words stored in the high frequency dictionary 30. The addressed word is read out of the dictionary as a group of ASCII coded characters that are stored in a token buffer 170 from which they can be transmitted serially to a readout terminal.

If the first nibble in the register 164 is decoded as a 5 or 6, the three nibbles in the register 164 are used to address one of 512 words in the low frequency dictionary 32. The word is then transferred from the dictionary to the token buffer 170 in the form of ASCII coded characters.

The nibbles in the register 164 may also decode to indicate a byte for byte punctuation token in which case a counter 172 is set to the value of the third nibble in the temporary register 164 and the corresponding number of bytes are transferred from the token register 132 through a gate 174 directly to the token buffer 170. If the first two nibbles decode as a repeat command, the counter 172 again is set to the count of the third nibble in the register 164 but the same byte is transferred to the token buffer 170 repetitively by the value of the counter 172. Thus the token buffer is filled with a byte in ASCII code repeated the designated number of times. With the global token decoded, the decode global control 162 signals for the next token to be gathered from memory.

A decode numeric signal activates a decode numeric control 176, as shown in FIG. 16. This causes the first nibble of the numeric token stored in the token register 132 to be transferred through a gate 178 to a counter 180. The counter is set to the number of digits in the numeric token. The counter then causes the corresponding number of nibbles to be transferred out of the token register 132 in sequence through a gate 182 to address a numeric table 184. The table stores the corresponding ASCII coded digits which are transferred to the token buffer 170. When all the digits have been decoded and stored in the buffer 170, the counter 180 causes the decode numeric control 176 to signal for the next token.

If an alpha token has been gathered in registers 147, 151, and 155, it sets a decode alpha control 186 to initiate first a prefix decoding operation by activating a decode prefix control 188. If the prefix counter 148 is not zero, the decode prefix control causes the first two nibbles in the prefix register 147 to be transferred to a temporary register 190. These two nibbles are used to address a prefix table which stores all of the prefixes as ASCII coded characters. The characters of the selected prefix are transferred to the token buffer 170, with the last character of the prefix being stored in a last character register 192. The decode prefix control also causes the prefix counter 148 to be decremented. If the counter is still not zero, the next two nibbles are transferred out of the register 147 to the register 190 and used to address the prefix table 194. Once the prefix counter 148 is decremented to zero, indicating that all of the prefixes have been decoded, the decode prefix control 188 sets the decode alpha control 186 to initiate a stem decoding operation.

Figure 18:
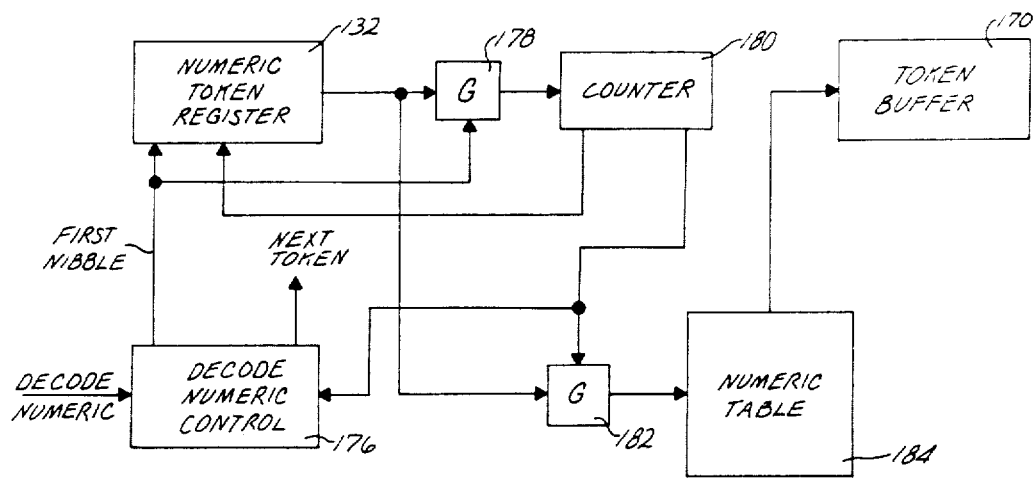

Referring to FIG. 18, the stem decoding operation is initiated by activating a decode stem control 196. This causes the first nibble in the stem register 155 to be transferred to the register 190 where it is decoded by a decode circuit 198. If the first nibble is a 15, then an additional nibble is required to identify the character. If it is less than 15, then the first nibble defines the corresponding ASCII character. The first nibble is used to address a plurality of tables. A table 200, designated the first character table, stores the ASCII coded letters in the order of their frequency of use as the first letters of a word. The remaining tables, two of which are indicated at 202 and 204, list the letters according to their frequency of use when following each of the letters A through Z. These tables correspond to the character tables described above in connection with FIG. 6. One of the tables is selected by decoding the characters stored in the last character register 192 and decode circuit 206. If there was no last character, the first character table 200 is selected. Similarly, if the last character was the letter A, the table 202 is selected, etc. The first nibble alone or in combination with the second nibble is used to address a particular letter in the selected table and transfer it as an ASCII coded byte to the token buffer 170 and the last character register 192 to replace the previous character stored in the register 192. This process is repeated by the decode stem control 196 unitl the stem counter 154 is decremented to zero, indicating that all of the stem has been decoded and stored in the token buffer 170. The decode alpha control 186 is then set to initiate a suffix decoding operation.

Referring to FIG. 19, a decode suffix control 210, when activated, causes the first two nibbles in the suffix register 151 to be transferred to the temporary register 190 and decrements the suffix counter 152. The generator and identifier nibbles in the register 190 address a suffix table 212 to select the corresponding suffix and transfer the suffix in the form of a series of ASCII coded characters to the token buffer 170. When the suffix counter 152 is decremented to zero, indicating that all of the suffixes have been decoded and stored in the token buffer 170, the decode suffix control 210 resets the decode alpha control 186 and signals for the next token. Thus a complete decoded alpha token is now assembled in the token buffer 170 and may be transmitted to the text receiving terminal 21.

From the above description, it will be seen that the present invention provides for the compression of English text coded in standard ASCII coded bytes for storage in memory as strings of four-bit nibbles. The nibbles can be later read out in sequence from the memory and decoded and assembled in the original English text. The invention takes advantage of the patterns of word structure and usage in English. Many of the smaller English words are among the most frequently used and therefore can be encoded as references into a global dictionary while many of the longer words can be broken down into a stem plus frequently used prefixes and suffixes that can be separately encoded. Also the invention takes advantage of the fact that certain letters more frequently occur following other letters. By making the split between one-nibble and two-nibble selection context-dependent, most all letters appearing in words can be encoded as a single nibble. In fact, perhaps 90 percent of the first letters and more than 95 percent of all other letters can be encoded using a single nibble. While described in terms of compressing English text, it will be appreciated that other natural languages can be similarly compressed by selecting appropriate dictionary, suffix, prefix, and letter tables.

What is claimed is:

1. A method of compressing information by coding and storing eight-bit binary coded alphabetic characters forming an individual word as a string of four-bit units, comprising:

storing in a first table a plurality of commonly used words, searching for the individual word being compressed in the first table, generating a group of units in response to a match with a word in the first table, coding the generated units to indicate with one unit that the word is in the first table and with at least one additional unit the location of the word in the first table, storing in a second table a plurality of common word prefixes, comparing a first group of characters starting at the beginning of said individual word being compressed with each of the prefixes in the second table when the full word is not present in the first table, generating a string of at least two four-bit units in response to a match between an initial group of characters in the word being compressed and a prefix in the second table, and coding one of the generated units to indicate with one unit that the prefix is in the second table and with at least one additional unit the location of the prefix in the second table, and comparing a group of characters of said word being compressed with each of the prefixes in the second table each time the preceding group matches one of the stored prefixes, and generating additional four-bit units in said string of units coded to indicate an additional prefix is in the second table and its location, and generating additional four-bit units codes to indicate respectively the number of remaining characters and the value of each remaining character in the word not part of a group of characters matched with a prefix in the second table.

2. The method of claim 1 futher including the steps of:

storing in a third table a plurality of suffixes, comparing successive groups of characters at the end of a word being compressed with suffixes in the third table when the full word is not composed of prefixes present in the second table, generating at least two units in response to a match between a group of characters in the word being compressed and a suffix in the third table, and coding the generated units to indicate the suffix is in the third table and the location of the suffix in the third table.

3. A method of storing alphanumeric text in a random access memory where the text is received as a string of characters, each character being coded as a standard 8-bit byte, comprising the steps of:

separating the string of characters into identifiable groups of one or more characters per group, comparing each selected group of characters with a first addressable table of stored groups of characters to determine if a corresponding group of characters is present in the table, storing a first 4-bit unit in said memory coded to indicate the entire group of characters is also present as a group in the first table and storing at least one additional 4-bit unit in said memory coded to indicate the address of the group of characters in the first table in the random access memory if a comparison between the selected group of characters and a group of characters in the table is found, comparing a first beginning portion of the selected group of characters with a second addressable table of stored groups of characters if all the characters of the selected group do not compare with any group of characters in the first table, storing a 4-bit unit coded to indicate that the first beginning portion of the selected group of characters in the second table and storing at least one additional 4-bit unit to indicate the address of the group of characters in the second table in the random access memory, comparing a second beginning portion of characters in said group of characters with said second table only if said first beginning portion is found in said second table, storing a 4-bit unit coded to indicate that the second beginning portion is in the second table and storing at least one additional 4-bit unit to indicate the address of the group of characters in the second table, comparing an ending portion of the selected group of characters with a third table of stored groups of characters if all the characters in one of said beginning portions do not compare with any group of characters in the second table, storing a 4-bit unit coded to indicate that the ending portion of the selected group of characters is in the third table and storing at least one additional 4-bit unit to indicate the address of the portion of ending characters found the third table in the random access memory, storing the number of any remaining characters after any portions found in the second and third tables have been identified or not found in the tables, and storing the remaining individual characters in coded form as one or more 4-bit units in the random access memory.

4. The method of claim 3 further including the steps of:
coding each of said remaining characters as a single 4-bit unit or as two 4-bit units depending on the location of the character in a table of characters.

5. The method of claim 4 further including the steps of:
determining which character, if any, preceded the character being coded, and selecting a different table of characters depending on the value of the preceding character.

6. A machine implemented method of compressing and storing information in the form of successive characters received as ASCII coded 8-bit bytes, by converting the information to strings of coded 4-bit nibbles, comprising the steps of:
decoding in a machine each byte in succession to determine if it is an alpha type character, a numeric type character, or a punctuation type character, storing in a memory successive characters of the same type as a separate group, encoding in said memory a group of numeric type characters as a string of 4-bit nibbles in which the first nibble is coded to indicate that the group of characters is a numerical type, the next nibble is coded to indicate the number of numeric characters in the group and each successive nibble is coded to indicate the value of each successive numeric character in the group, and storing in a memory the string of encoded 4-bit nibbles.

7. The method of claim 6 further including the steps of:
comparing a stored group of punctuation or alpha characters with a plurality of different groups of characters stored as words in a dictionary table, encoding the group of punctuation or alpha characters as a string of 4-bit nibbles which identify the location of the same group of characters if present in the table, and storing the string of encoded 4-bit nibbles.

8. The method of claim 6 further including the steps of:
determining when a group of alpha characters is not found in the dictionary table, comparing the beginning characters of the group with a plurality of beginning character combinations stored in a prefix table, encoding the beginning characters as a plurality of 4-bit nibbles indicating the location of the corresponding prefix in the prefix table if present in the prefix table, comparing the ending characters of the group of alpha characters with a plurality of ending characters stored in a suffix table, encoding the ending characters as a plurality of 4-bit nibbles indicating the location of the ending characters as a plurality of 4-bit nibbles, comparing each of any remaining characters with a set of characters in a character table, and encoding the character as one or more 4-bit nibbles indicating the location of the character in the character table.

9. The method of claim 8 further including the steps of:
providing separate tables of characters for each of the possible alpha characters, and selecting one of the character tables according to the particular preceding character in the group being encoded.

10. A method of encoding alpha character words in which the individual characters of the words are initially coded in ASCII coded 8-bit bytes, comprising the steps of:
storing a set of word beginning character combinations in a prefix memory, comparing the beginning characters of the alpha word being encoded with each of the beginning character combinations in the prefix memory to determine if the same combination of beginning characters of the alpha word are present in the prefix memory, generating and storing a binary coded value indicating that the beginning combination of characters of the alpha word are in the prefix memory and indicating the location in the prefix memory if the beginning characters are present in the prefix table, deleting the beginning characters from the alpha word if they are present in the prefix memory, storing a set of word ending character combinations in a suffix memory, comparing the ending characters of the word being encoded with each of the ending character combinations in the suffix memory, generating and storing a binary coded value indicating that the ending character combination of the alpha word is in the suffix memory and indicating the location in the suffix memory, deleting the ending characters from the alpha character word if they are present in the suffix memory, storing at least one set of all possible alpha characters in a predetermined sequence in a character memory, generating and storing a binary coded value indicating the number of characters remaining in the alpha word being encoded after any prefix and/or suffix characters have been deleted, and generating and storing a binary coded value for each of the remaining characters in the alpha word, the coded value indicating the location of the alpha character in the character memory.

11. A method of decoding a compressed word of information stored as a string of 4-bit nibbles into a set of ASC11 coded 8-bit bytes wherein the value and relative sequential position of the respective nibbles in the string is used to select the bytes, comprising the steps of:
determining the value of the first nibble in the string;
if the first nibble is a first predetermined value, using the second nibble to address a first table of ASC11 coded character combinations forming the beginning of words;

storing the addressed combination of characters from the first table as the prefix of the word;

if the first nibble is a second predetermined value, using the second nibble to address a second table of ASC11 coded character combinations forming the ending of words;

storing the addressed combination of characters from the second table as the suffix of the word;

if the first nibble is either said first or said second predetermined value and the third nibble is a third predetermined value, using the fourth nibble to count out a corresponding number of succeeding nibbles;

using each of said succeeding nibbles to address a table of individual ASC11 coded characters; and storing the addressed characters from the table as the stem of the word.

12. Apparatus for compressing English text coded as a sequence of ASCII coded 8-bit bytes as strings of 4-bit nibbles comprising:

means storing a group of bytes corresponding to one word of text, means for comparing the beginning bytes of the stored word with groups of bytes stored in a prefix table, means responsive to the comparing means for signaling whether or not the group of bytes is in the prefix table, means responsive to the signaling means for generating at least two nibbles identifying the location of the beginning group of bytes in the prefix table, means removing the beginning group of bytes from the stored word of text, means responsive to the signaling means when the beginning bytes are not in the prefix table for comparing the ending bytes of the stored word with groups of bytes stored in a suffix table, means for signaling whether or not the ending group of bytes is in the suffix table, means responsive to the signaling means for generating at least two nibbles identifying the location of the ending group of bytes in the suffix table, means removing the ending group of bytes from the stored word, means responsive to the signaling means when the ending bytes are not in the suffix tables for counting the number of remaining bytes of the stored word, means generating a nibble indicating the counted number of remaining bytes, means responsive to each of said remaining bytes in sequence for comparing each byte with all characters stored in a character table, means responsive to the comparing means for generating at least one nibble for each byte identifying the location of the same byte in the table of characters, and means storing each of said generated nibbles in predetermined sequence.

13. Apparatus of claim 12 further including means for storing a plurality of tables of characters coded as bytes, each table having a portion of the characters addressable by a single nibble and a portion of the character addressable by two nibbles, the characters stored respectively in the two portions being different for each table, means for selecting one of the tables to operate with said means for comparing each byte with characters stored in a character table.

14. Apparatus of claim 13 further including means responsive to the value of the byte in the stored group preceeding the byte being compared for selecting one of said plurality of character tables, each character having an associated table of characters arranged in the two portions of the table according to the frequency in which each character in the table follows the associated preceeding character in standard English words.

15. Apparatus of claim 12 further comprising:

means sensing when the stored group of bytes are numeric characters, means responsive to said sensing means for counting the number of bytes in the stored group of bytes, means generating a first nibble coded to indicate the word is numeric, means generating a second nibble coded to indicate the number of bytes counted, and means generating an additional nibble for each numeric byte coded to indicate the corresponding digit value, the generated nibbles being stored sequentially.

16. Apparatus of claim 12 further including means sensing when the stored group of bytes are punctuation characters, means responsive to the signaling means and the sensing means when the stored group of bytes is not in the dictionary table and the stored group of bytes are punctuation characters for counting the number of bytes in the stored group of bytes, means generating at least two nibbles coded to indicate that the bytes are punctuation and not in the dictionary table, means generating a nibble indicating the number of bytes counted, and means storing said generated nibbles followed by all the bytes in their ASCII coded form in sequence.

17. Apparatus for encoding alpha words, as a string of 4-bit units, comprising:

addressable memory means for storing first and second tables of the characters of the alphabet, the first table having the most commonly used alpha characters means generating a first 4-bit unit indicating that an alpha word is being encoded, means generating a second 4-bit unit coded to identify the number of characters in the alpha word, means determining in which table each character of the alpha word is found, and means generating a third 4-bit unit for each character in the alpha word found in the first table, the 4-bit unit being coded to identify the address of such character found in the first table, and means generating third and fourth 4-bit units for each character in the alpha word found in the second table.

18. A method of compressing information by coding and storing 8-bit binary coded alphabetic characters forming an individual word as a string of 4-bit units, comprising:

storing in a first table a plurality of commonly used words, storing in a second larger table a plurality of less commonly used words, searching for the individual word being compressed in the first table, generating a group of 4-bit units in response to a match with a word in the first table, coding the group of units to indicate the presence and location of the word in the first table, searching in the second table for the individual word being compressed when the word is not present in the first table, generating a group of units in response to a match with a word in the second table, and coding the generated group of units to indicate the presence and location of the word in the second table, the number of coded units used for a word in the second table being at least one unit larger than the number of coded units used for a word in the first table, whereby greater compression is provided for more commonly used words.

* * * * *